(12) United States Patent
Yoon et al.

(10) Patent No.: US 9,036,425 B2
(45) Date of Patent: May 19, 2015

(54) MEMORY DEVICES FOR REDUCING BOOSTING CHARGE LEAKAGE AND SYSTEMS INCLUDING THE SAME

(75) Inventors: Chi Weon Yoon, Seoul (KR); Sang-Wan Nam, Hwaseong-si (KR); Dong Hyuk Chae, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 748 days.

(21) Appl. No.: 13/229,107

(22) Filed: Sep. 9, 2011

(65) Prior Publication Data

US 2012/0063235 A1  Mar. 15, 2012

(30) Foreign Application Priority Data

Sep. 13, 2010  (KR) .................. 10-2010-0089240

(51) Int. Cl.
*G11C 16/06* (2006.01)
*G11C 16/04* (2006.01)
*G11C 16/34* (2006.01)

(52) U.S. Cl.
CPC ........ *G11C 16/0483* (2013.01); *G11C 16/3418* (2013.01)

(58) Field of Classification Search
CPC ............... G11C 16/0483; G11C 16/10; G11C 16/3427; G11C 11/5621; G11C 16/08; G11C 8/08
USPC .......................... 365/185.23, 185.17, 185.18
See application file for complete search history.

(56) References Cited

U.S. PATENT DOCUMENTS

| 6,501,111 | B1 | 12/2002 | Lowrey |
| 7,233,522 | B2 * | 6/2007 | Chen et al. ............... 365/185.02 |
| 2005/0122779 | A1 * | 6/2005 | Fasoli et al. ............. 365/185.17 |
| 2012/0275210 | A1 * | 11/2012 | Yan et al. ...................... 365/148 |

FOREIGN PATENT DOCUMENTS

| JP | 2000114453 A | 4/2000 |
| KR | 20040047712 A | 6/2004 |
| KR | 100827697 B1 | 4/2008 |

* cited by examiner

*Primary Examiner* — Tuan T Nguyen
(74) *Attorney, Agent, or Firm* — Harness, Dickey & Pierce, P.L.C.

(57) ABSTRACT

A three-dimensional (3D) non-volatile memory includes a memory cell array and a merge driver configured to apply a merge voltage at the same level to a common source line and a bulk in the memory cell array.

19 Claims, 13 Drawing Sheets

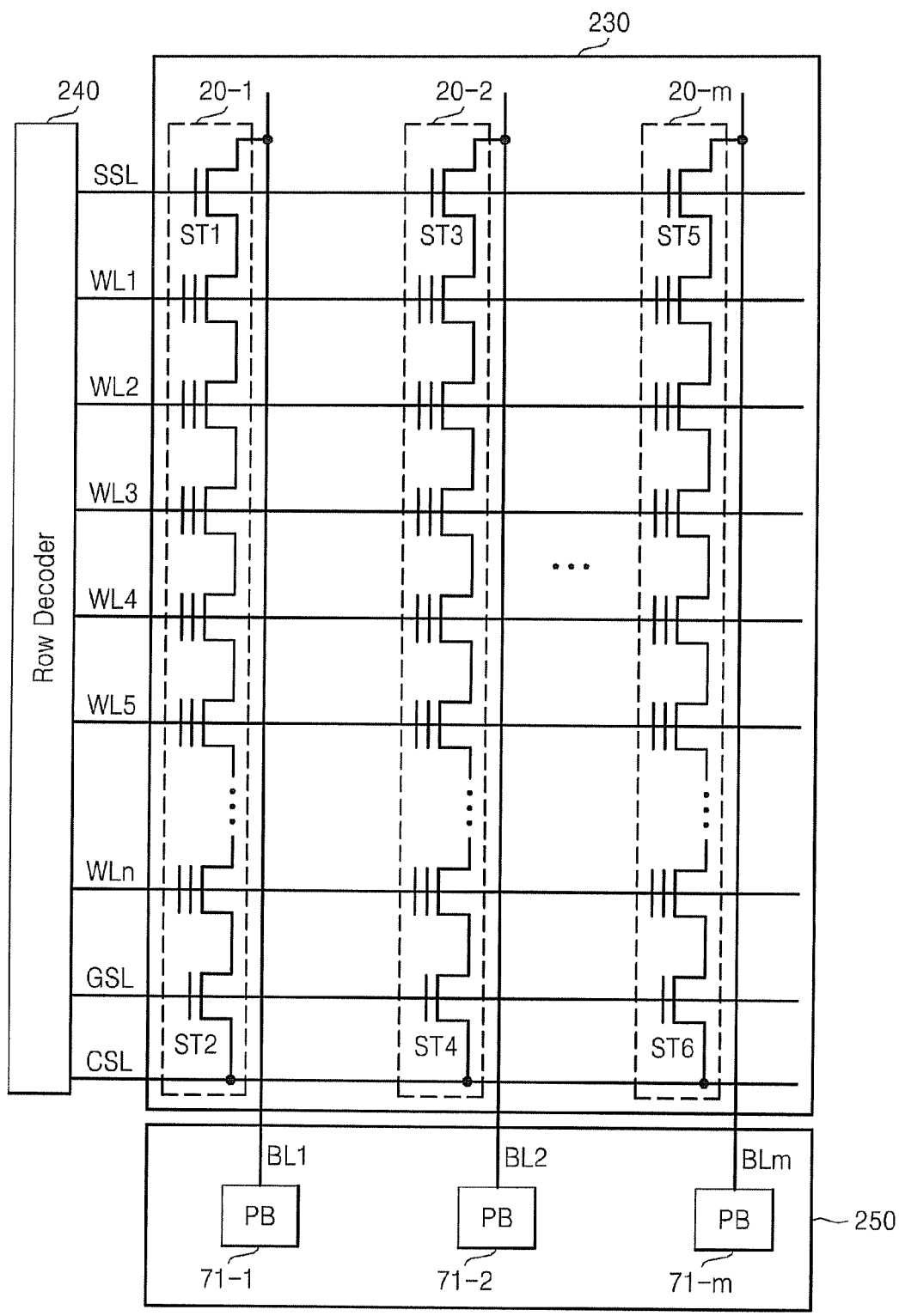

MEMORY DEVICES FOR REDUCING BOOSTING CHARGE LEAKAGE AND SYSTEMS INCLUDING THE SAME

CROSS-REFERENCE TO RELATED APPLICATION

This application claims priority under 35 U.S.C. §119 to Korean Patent Application No. 10-2010-0089240, filed on Sep. 13, 2010, in the Korean Intellectual Property Office (KIPO), the entire contents of which is incorporated herein by reference.

BACKGROUND

1. Field

Example embodiments relate to semiconductor memory devices, and more particularly, to semiconductor memory devices reducing boosting charge leakage and systems including the same.

2. Description of the Related Art

Flash memory used as electrically erasable programmable read-only memory (EEPROM) has the capability of random access memory (RAM) in which data can be readily programmed and erased, and the capability of read-only memory (ROM) in which data can be retained without a supply of power. Accordingly, flash memory is widely used as a storage medium in portable electronic devices such as digital cameras, personal digital assistants (PDAs), and MP3 players.

SUMMARY

Some example embodiments of the inventive concepts may provide memory devices for efficiently reducing boosting charge leakage and systems including the same.

According to some example embodiments of the inventive concepts, there is provided a three-dimensional (3D) non-volatile memory device including a memory cell array and a merge driver configured to apply a merge voltage at the same level to a common source line and a bulk in the memory cell array.

The bulk may be a PP well of the memory cell array. The merge driver may apply the merge voltage at the same level to the common source line and the bulk in the memory cell array during a read operation, a program operation, or an erase operation of the 3D non-volatile memory device. The merge driver may apply a ground voltage to the common source line and the bulk in the memory cell array during the read operation or the program operation. The merge driver may apply an erase voltage to the common source line and the bulk in the memory cell array during the erase operation.

According to other example embodiments of the inventive concepts, there is provided a memory system including the above-described 3D non-volatile memory device and a memory controller configured to control the 3D non-volatile memory device.

According to further example embodiments of the inventive concepts, there is provided a data storage system including a plurality of memory modules forming a redundant array of independent disks (RAID) array and a RAID controller configured to control operations of the memory modules. Each of the memory modules includes a plurality of 3D non-volatile memory devices and a memory controller configured to control operations of the 3D non-volatile memory devices. Each of the 3D non-volatile memory devices includes a memory cell array and a merge driver configured to apply a merge voltage at the same level to a common source line and a bulk in the memory cell array.

According to at least one example embodiment, a three-dimensional (3D) non-volatile memory device comprises a memory cell array and a merge driver configured to apply a merge voltage to a common source line and a bulk in the memory cell array.

According to at least one example embodiment, a data storage system includes a plurality of memory modules forming a redundant array of independent disks (RAID) array, each of the memory modules including a plurality of three-dimensional (3D) non-volatile memory devices and a memory controller configured to control operations of the 3D non-volatile memory devices, each of the 3D non-volatile memory devices including a memory cell array, and a merge driver configured to apply a merge voltage to a common source line and a bulk in the memory cell array, and a RAID controller configured to control operations of the memory modules.

According to at least one example embodiment, a three-dimensional (3D) non-volatile memory device includes a common source line commonly connected with a device active region.

BRIEF DESCRIPTION OF THE DRAWINGS

Example embodiments will be more clearly understood from the following brief description taken in conjunction with the accompanying drawings. FIGS. 1-11 represent non-limiting, example embodiments as described herein.

FIG. 2 is a diagram illustrating a memory cell array of FIG. 1A in two dimensions;

FIG. 3 is a diagram illustrating a memory cell array of FIG. 1A in three dimensions;

FIG. 4 is a diagram illustrating some cell strings of the two-dimensional (2D) memory cell array of FIG. 2;

FIG. 5 is a diagram illustrating some of a plurality of cell strings in the three-dimensional (3D) memory cell array of FIG. 3;

FIGS. 7-10 are diagrams illustrating memory systems including the non-volatile memory devices illustrated in FIG. 1A according to different example embodiments of the inventive concepts; and FIG. 11 is a block diagram of data storage systems including the memory systems of FIG. 10.

Figure 1A:
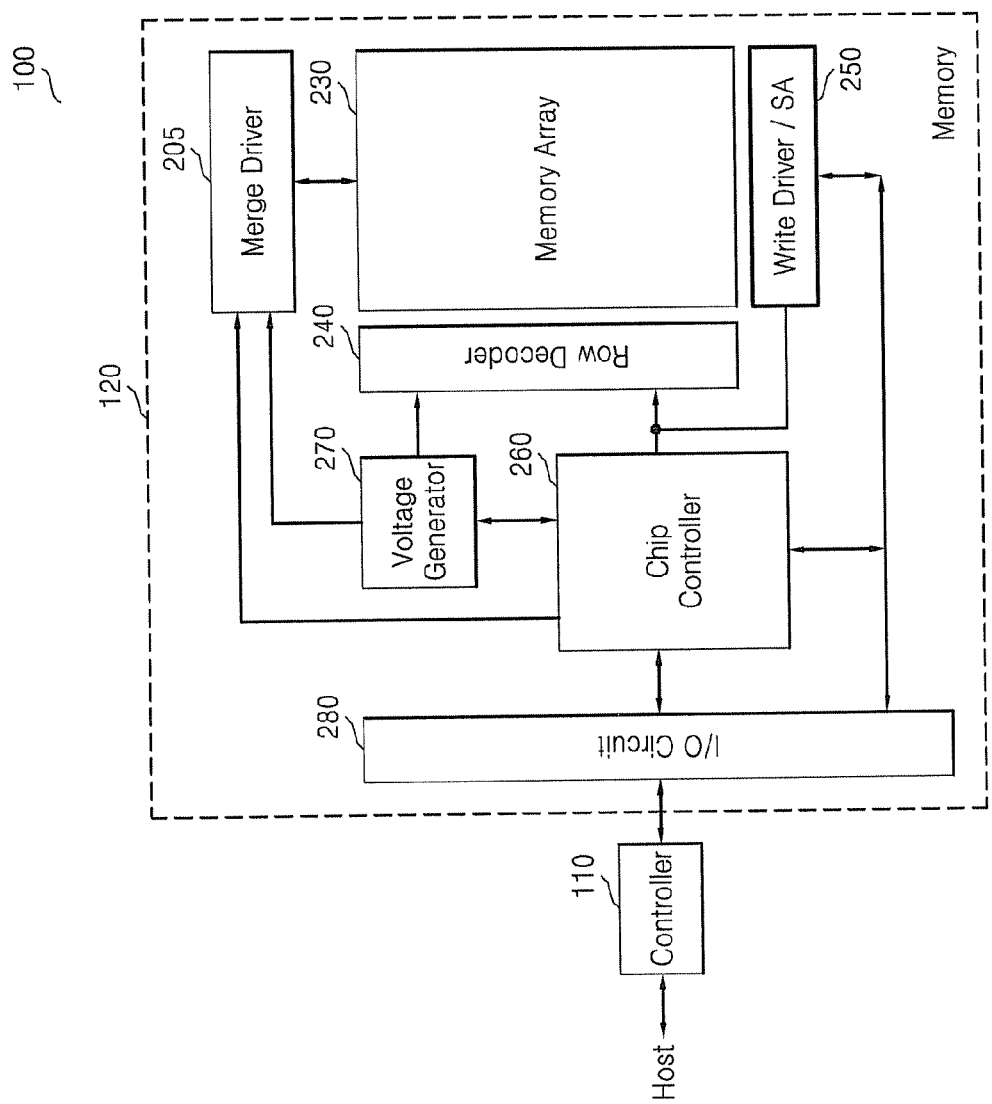
FIG. 1A is a block diagram illustrating non-volatile memory systems according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
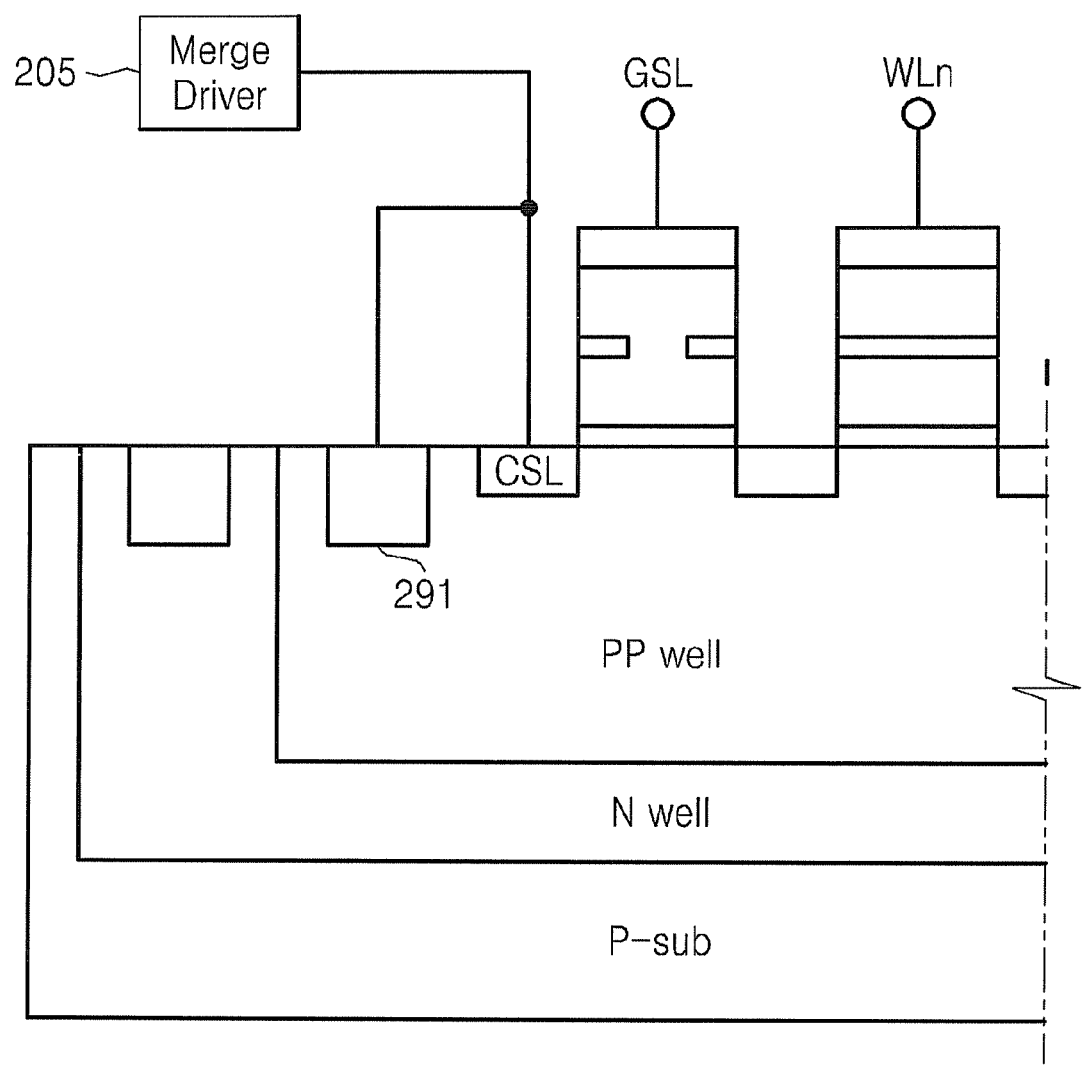
FIG. 1B is a diagram illustrating a connection between a memory cell array and a merge driver illustrated in FIG. 1A.

FIG. 1A is a block diagram illustrating non-volatile memory systems 100 according to some example embodiments of the inventive concepts. FIG. 1B is a diagram illustrating a connection between a memory cell array 230 and a merge driver 205 illustrated in FIG. 1A. Referring to FIGS. 1A and 1B, a non-volatile memory system 100 may include a non-volatile memory device 120 and a memory controller 110 controlling the non-volatile memory device 120. The non-volatile memory device 120 may be implemented using, for example, NOR flash memory and/or NAND flash memory, but example embodiments of the inventive concepts are not restricted thereto. The non-volatile memory device 120 may include a merge driver 205, a memory cell array 230, a row decoder 240, a write driver/sense amplifier (SA) circuit 250, a chip controller 260, a voltage generator 270 and an input/output (I/O) circuit 280.

The merge driver 205 may provide a merge voltage to the memory cell array 230 and a common source line CSL (see FIG. 2) connected to the memory cell array 230 in association with the voltage generator 270 and the chip controller 260. The same voltage (e.g., the merge voltage) may be applied to a pocket p-type (PP) well of the memory cell array 230 and to the common source line CSL connected to the memory cell array 230. The row decoder 240 may select one word line from among a plurality of word lines in response to a row address, apply a first operating voltage to the selected word line, and apply a second operating voltage to unselected word lines. For example, the row decoder 240 may apply the first operating voltage (e.g., a program voltage) to the selected word line and the second operating voltage (e.g., a pass voltage) to the unselected word lines in a program operation. The row decoder 240 may apply the first operating voltage (e.g., a ground voltage) to the selected word line and the second operating voltage (e.g., a read voltage) to the unselected word lines in a read operation.

The write driver/SA circuit 250 may be selectively connected to a plurality of bit lines and may write and/or program data to selected memory cells and/or read data from the selected memory cells by sensing and amplifying the data. The write driver/SA circuit 250 may include a plurality of data storage units (not shown) to store a data set to be programmed in the program operation and to store a data set read from memory cells in the read operation. Each of the data storage units may be implemented by, for example, a plurality of latches. The data storage units may also store a data set read in a program verify operation. A switching block (not shown) may be further provided between the write driver/SA circuit 250 and the memory cell array 230 to selectively connect a write driver and/or an SA to the plurality of bit lines.

The chip controller 260 may output internal control signals (not shown) for controlling the operations (e.g., the program operation, the erase operation, and/or the read operation) of the non-volatile memory device 120 in response to an external command. The voltage generator 270 may generate voltages (e.g., a program voltage, a pass voltage, and/or a read voltage) for the operations of the non-volatile memory device 120. The I/O circuit 280 may interface the non-volatile memory device 120 with an external device, for example, the memory controller 110. The I/O circuit 280 may receive commands and/or data to be programmed from the external device, and may transmit state signals and read data to the external device. The memory controller 110 may control overall data exchange between a host and the non-volatile memory device 120. For example, the memory controller 110 may control the non-volatile memory device 120 to write data and/or read data according to the control of the host.

Referring to FIG. 1B, the merge driver 205 may apply a merge voltage of the same level to a PP well and a common source line CSL within an N well formed in a P-type substrate P-sub. The merge voltage may be either a positive voltage and/or a negative voltage. Reference numeral 291 in FIG. 1B may denote an active area receiving a voltage applied to the PP well. For example, the merge driver 205 may apply the ground voltage to the PP well and the common source line CSL during a read and/or program operation and an erase voltage (e.g., 20 V) to the PP well and the common source line CSL during the erase operation. The merge driver 205 may apply a voltage to the PP well and the common source line CSL that is a same voltage (e.g., a same voltage level). Using the merge driver 205 may be more efficient and/or improved because, for example, a single driver may be used. A ground source line GSL and a word line (WLn) may be on the PP well.

Although example embodiments describe a particular doping scheme, one of ordinary skill in the art understands that other doping schemes may be used and the doping of various features is not limited to that illustrated in FIG. 1B.

Figure 3:
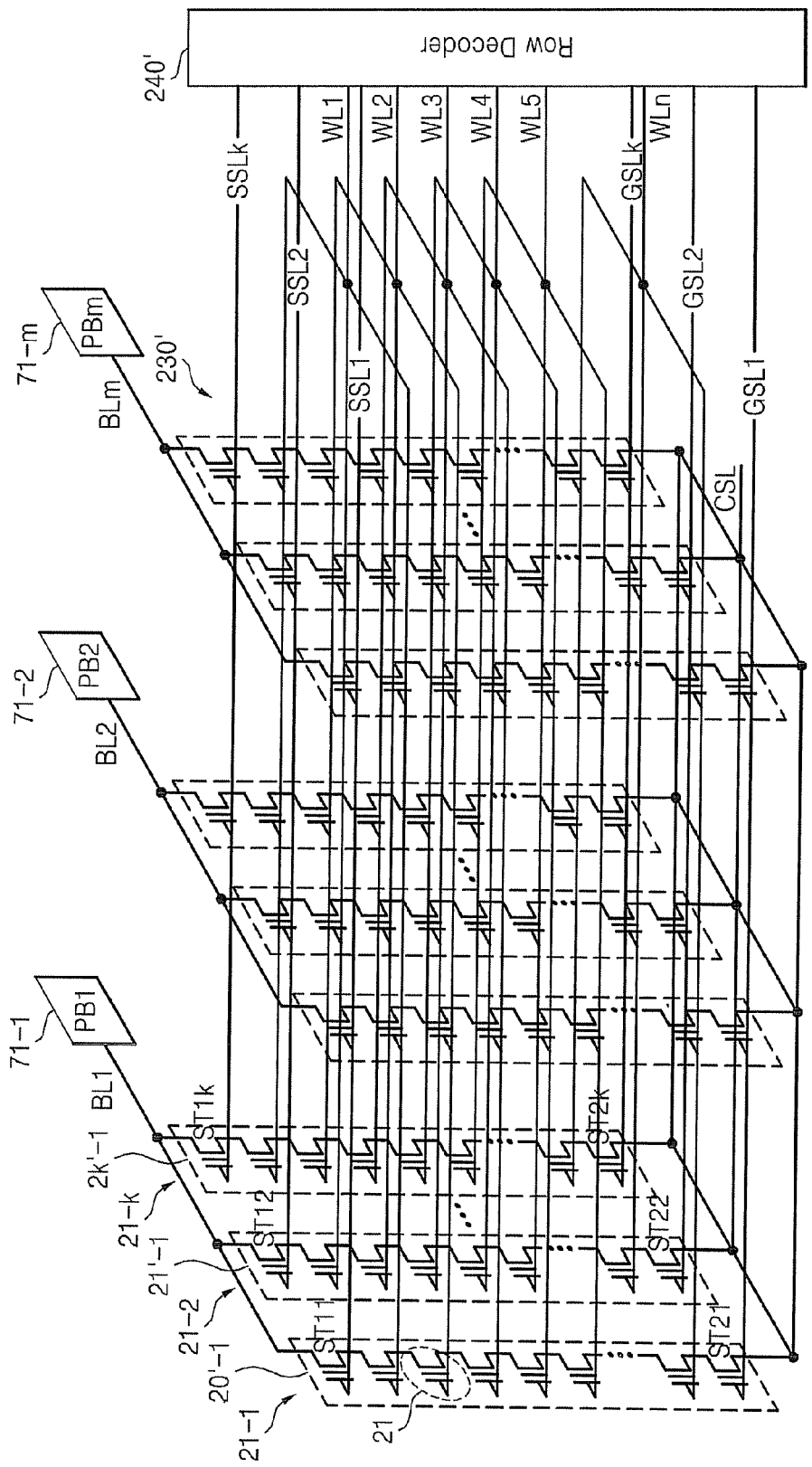

FIG. 2 is a diagram illustrating a memory cell array 230 of FIG. 1A in two dimensions. FIG. 3 is a diagram illustrating a memory cell array 230 of FIG. 1A in three dimensions. Referring to FIG. 2, a memory cell array 230 may include a plurality of cell strings 20-1, 20-2, . . . , 20-$m$ where "m" is a natural number. Each of the cell strings 20-1 through 20-$m$ may include a plurality of non-volatile memory cells connected to word lines WL1-WLn. Cell strings may be laid out or embodied on one plane in two dimensions, as illustrated in FIG. 2, or on different planes or layers in three dimensions, as illustrated in FIG. 3. The cell string 20-1 illustrated in FIG. 2 may include a first selection transistor ST1 connected to a string selection line (SSL), and to a page buffer 71-1 through a bit line BL1. A second selection transistor ST2 may be connected to a common source line CSL (e.g., ground) and a ground selection line GSL. A plurality of non-volatile memory cells may be connected in series between the first and second selection transistors ST1 and ST2.

The cell string 20-2 may include a third selection transistor ST3 connected to a page buffer 71-2 through a bit line BL2, a fourth selection transistor ST4 connected to a common source line CSL (e.g., ground), and a plurality of non-volatile memory cells connected in series between the third and fourth selection transistors ST3 and ST4. The cell string 20-$m$ may include a fifth selection transistor ST5 connected to a page buffer 71-$m$ through a bit line BLm, a sixth selection transistor ST6 connected to the common source line CSL (e.g., ground), and a plurality of non-volatile memory cells connected in series between the fifth and sixth selection transistors ST5 and ST6. The non-volatile memory cells included in each of the cell strings 20-1 through 20-$m$ may be implemented by, for example, electrically erasable programmable read-only memory (EEPROM) cells that can store one or more bits. The non-volatile memory cells may be implemented by, for example, NAND flash memory cells (e.g., single level cells (SLCs) or multi-level cells (MLCs) which may store one or more bits). The cell strings 20-1 through 20-$m$ may be referred to as NAND strings.

Referring to FIG. 3, each of a plurality of layers 21-1, 21-2, . . . , 21-$k$ (where "k" is a natural number) may include a plurality of cell strings. A first cell string 20'-1 may be in the first layer 21-1, a second cell string 21'-1 may be in the second layer 21-2 different from the first layer 21-1, and a k-th cell string 2$k$'-1 may be in the k-th layer 21-$k$ different from the second layer 21-2 so that the first through k-th cell strings 20'-1, 21'-1, and 2$k$'-1 may be laid out in three dimensions. The first cell string 20'-1 in the first layer 21-1 may include a plurality of non-volatile memory cells (e.g., NAND flash memory cells) connected in series between a plurality of selection transistors ST11 and ST21. The second cell string 21'-1 in the second layer 21-2 may include a plurality of non-volatile memory cells (e.g., NAND flash memory cells) connected in series between a plurality of selection transistors ST12 and ST22. The k-th cell string 2$k$'-1 in the k-th layer 21-$k$ may include a plurality of non-volatile memory cells (e.g., NAND flash memory cells) connected in series between a plurality of selection transistors ST1$k$ and ST2$k$.

A row decoder 240' illustrated in FIG. 3 may provide a selection signal (e.g., a read voltage during a read operation, a power supply voltage during a program operation, and/or 0 V during an erase operation) to string selection lines SSL1, SSL2, . . . , SSLk connected to the gates of the respective first selection transistors ST11, ST12, . . . , ST1$k$ implemented in the layers 21-1 through 21-$k$, respectively. The first selection transistors ST11 through ST1$k$ may be selectively turned on or off. The row decoder 240' may also provide a selection signal (e.g., the read voltage during the read operation and/or 0 V during the program operation and the erase operation) to ground selection lines GSL1, GSL2, . . . , GSLk connected to the gates of the respective second selection transistors ST21, ST22, . . . , ST2$k$ implemented in the layers 21-1 through 21-$k$, respectively. The second selection transistors ST21-ST2$k$ may be selectively turned on or off. Each of the cell strings 20'-1 through 2$k$'-1 embodied in the respective layers 21-1 through 21-$k$ may be selected by the row decoder 240'.

As illustrated in FIG. 3, the cell strings 20'-1 through 2$k$'-1 may share with one another a plurality of word lines WL1-WLn, a common source line CSL and a bit line BL1. Cell strings at corresponding positions in the respective layers 21-1 through 21-$k$ may be connected by bit lines BL1-BLm to a corresponding one among the page buffers 71-1 through 71-$m$ included in a write driver/SA circuit 250.

Figure 4:
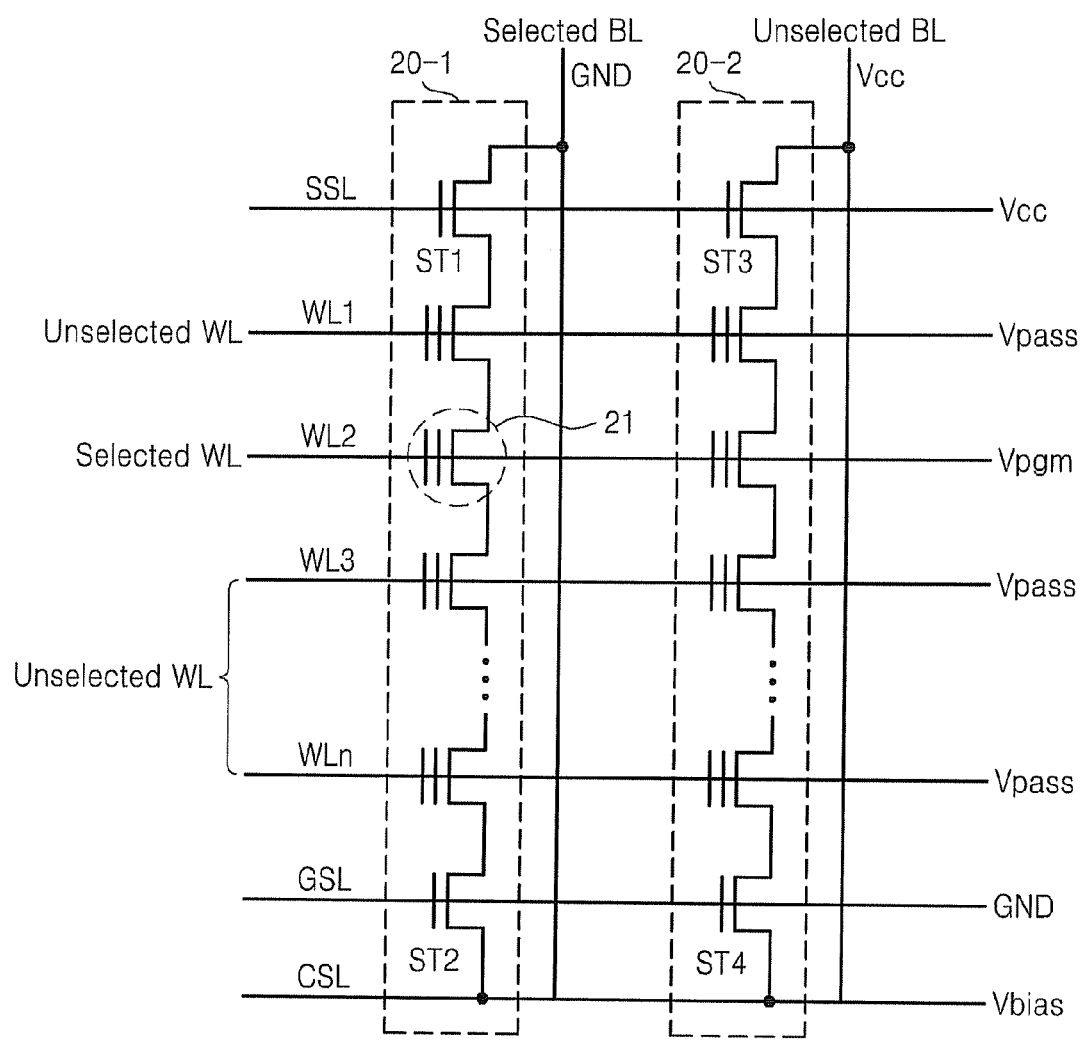

FIG. 4 is a diagram illustrating cell strings 20-1 and 20-2 of the 2D memory cell array 230 of FIG. 2. Referring to FIG. 4, a program verify voltage Vpgm output from the voltage generator 270 may be applied to the selected word line WL2 among the plurality of word lines WL1-WLn. A pass voltage Vpass may be applied to the remaining word lines WL1 and WL3-WLn. A ground voltage GND may be applied to a selected bit line including a selected cell 21 and a power supply voltage Vcc may be applied to an unselected bit line. The power supply voltage Vcc may be applied to the string selection line SSL connected to gates of the respective first and third selection transistors ST1 and ST3. A ground voltage GND may be applied to the ground selection line GSL connected to the gates of the respective second and fourth selection transistors ST2 and ST4. The cell string 20-2 that is connected to the unselected bit line may become ready for shut-off.

Usually charge leakage due to boosting may occur at the third and fourth selection transistors ST3 and ST4. Increased boosting charge leakage may occur at the fourth selection transistor ST4, the gate of which the ground voltage GND may be applied, as compared to the third selection transistor ST3, the gate of which the power supply voltage Vcc may be applied. To prevent and/or reduce this charge leakage, a bias voltage Vbias may be applied to the common source line CSL (e.g., instead of a ground voltage).

Figure 5:
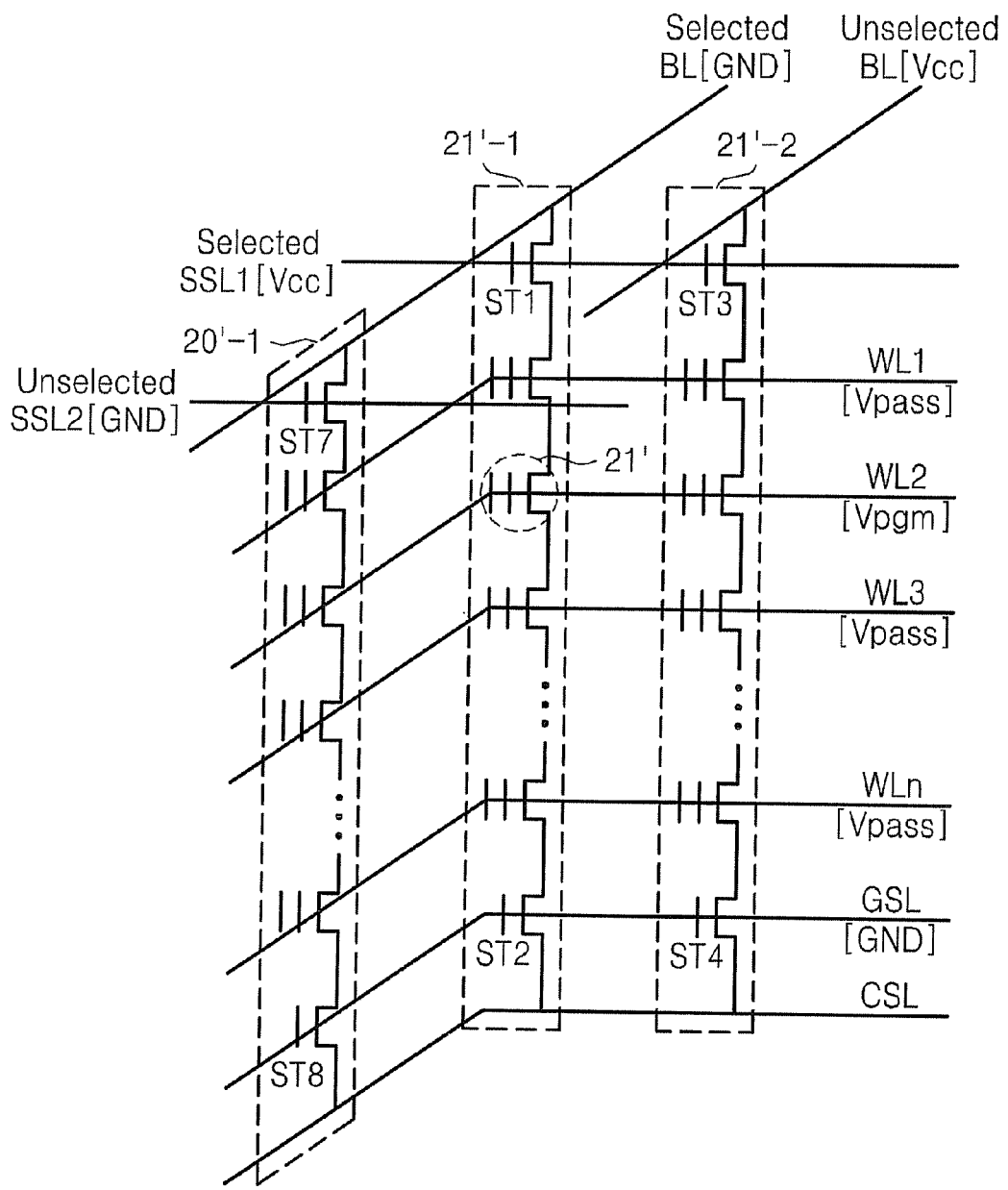

FIG. 5 is a diagram illustrating strings 20'-1, 21'-1, and 21'-2 of cell strings in the 3D memory cell array 230' of FIG. 3. Referring to FIG. 5, a program verify voltage Vpgm output from the voltage generator 270 may be applied to a selected word line WL2 among the word lines WL1-WLn and a pass voltage Vpass may be applied to the remaining word lines WL1 and WL3-WLn. A ground voltage GND may be applied to the selected bit line including a selected cell 21' and the power supply voltage Vcc may be applied to the unselected bit line. The power supply voltage Vcc may be applied to the first string selection line SSL1 connected to the gates of the respective first and third selection transistors ST1 and ST3 and the ground voltage GND may be applied to the ground selection line GSL connected to the gates of the respective second and fourth selection transistors ST2 and ST4. A ground voltage GND may be applied to the second string selection line SSL2, which does not include the selected cell 21' and may be connected to a gate of a seventh selection transistor ST7, for program inhibition. The ground voltage GND may be applied to the ground selection line GSL connected to a gate of an eighth selection transistor ST8 included in the cell string 20'-1 that may include the seventh selection transistor ST7.

In example embodiments illustrated in FIG. 5 for the 3D memory cell array 230', the seventh and eighth selection transistors ST7 and ST8 may also need to be considered as compared to the example embodiments illustrated in FIG. 4 for the 2D memory cell array 230. The eighth selection transistor ST8 may share the ground selection line GSL and the common source line CSL with the fourth selection transistor ST4. The fourth and eighth selection transistors ST4 and ST8 may have the same conditions applied for reducing boosting charge leakage. As for the seventh selection transistor ST7, the ground voltage GND may be applied to the second string selection line SSL2. The ground voltage GND may be applied to the gate of the seventh selection transistor ST7 and to the selected bit line. Even though the seventh selection transistor ST7 may have the above-described conditions, it may not matter much in terms of charge leakage due to boosting. Because the fourth and eighth selection transistors ST4 and ST8 have similar conditions to the seventh selection transistor ST7, it may not be necessary to specially drive a bias voltage to the common source line CSL to reduce boosting charge leakage.

The fourth and eighth selection transistors ST4 and ST8 may not need to specially drive a bias voltage of the common source line CSL in the 3D memory cell array 230' to prevent boosting charge leakage as in the example embodiments illustrated in FIG. 4 and a voltage at the same level as a voltage applied to the PP well may be applied to the common source line CSL. The non-volatile memory system 100 according to some example embodiments of the inventive concepts may efficiently reduce boosting charge leakage by using only a single merged driver without using both a bulk driver 210 and a common source line (CSL) driver 220 which may be used in the comparison example illustrated in FIGS. 6A and 6B.

Figure 6A:
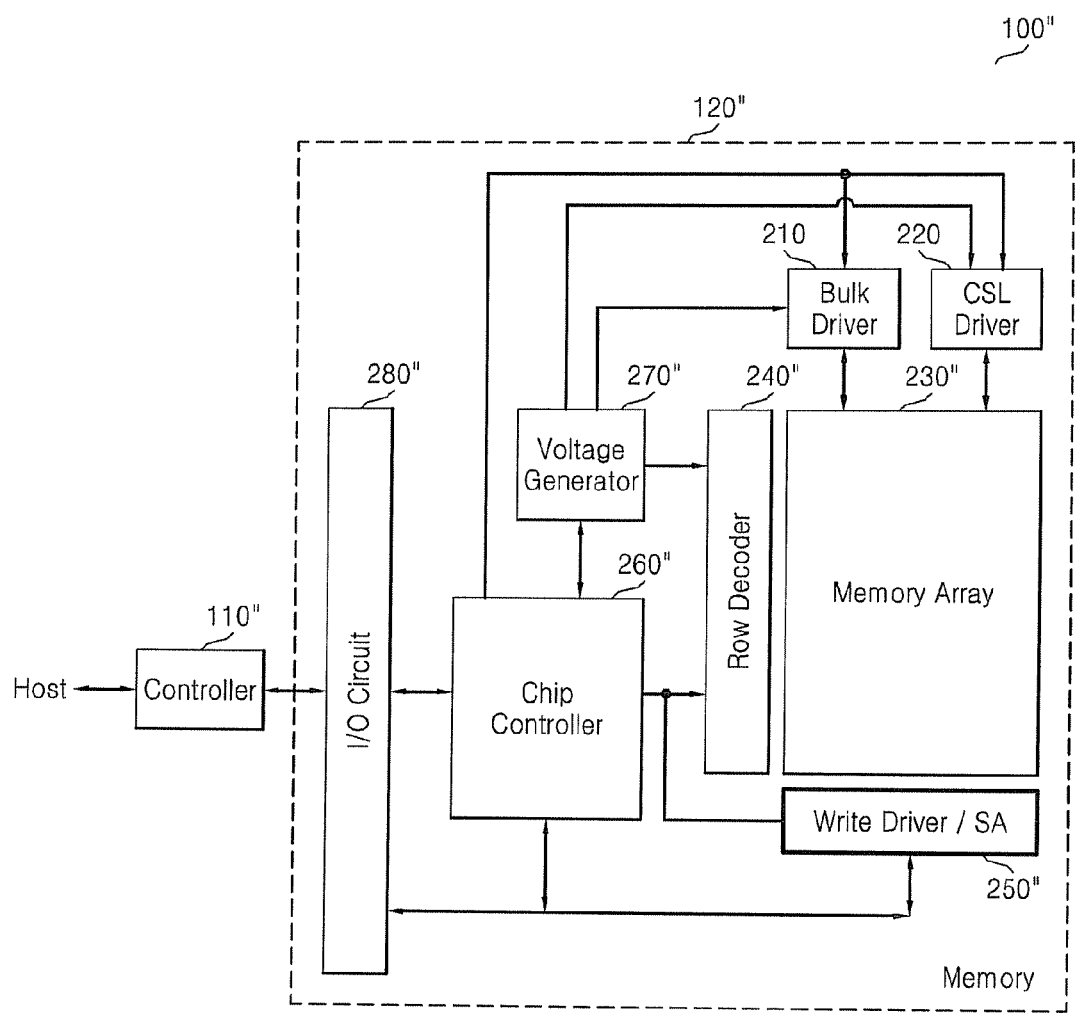
FIG. 6A is a block diagram illustrating a non-volatile memory system of a comparative example.

FIG. 6A is a block diagram illustrating a non-volatile memory system 100" of a comparative example. Referring to FIG. 6A, the non-volatile memory system 100" may include a non-volatile memory device 120" and a memory controller 110" controlling the non-volatile memory device 120". The non-volatile memory device 120" may include the bulk driver 210, the CSL driver 220, a memory cell array 230", a row decoder 240", a write driver/SA circuit 250", a chip controller 260", a voltage generator 270", and an I/O circuit 280". Apart from the bulk driver 210 and the CSL driver 220, the remaining members of the non-volatile memory system 100" may be the same or similar to those described with reference to FIG. 1A. The bulk driver 210 may provide a bulk voltage to the memory cell array 230" in association with the voltage generator 270". The chip controller 260" and the CSL driver 220 may provide a bias voltage to the common source line CSL (shown in FIG. 2) connected to the memory cell array 230" in association with the voltage generator 270" and the chip controller 260".

Figure 6B:
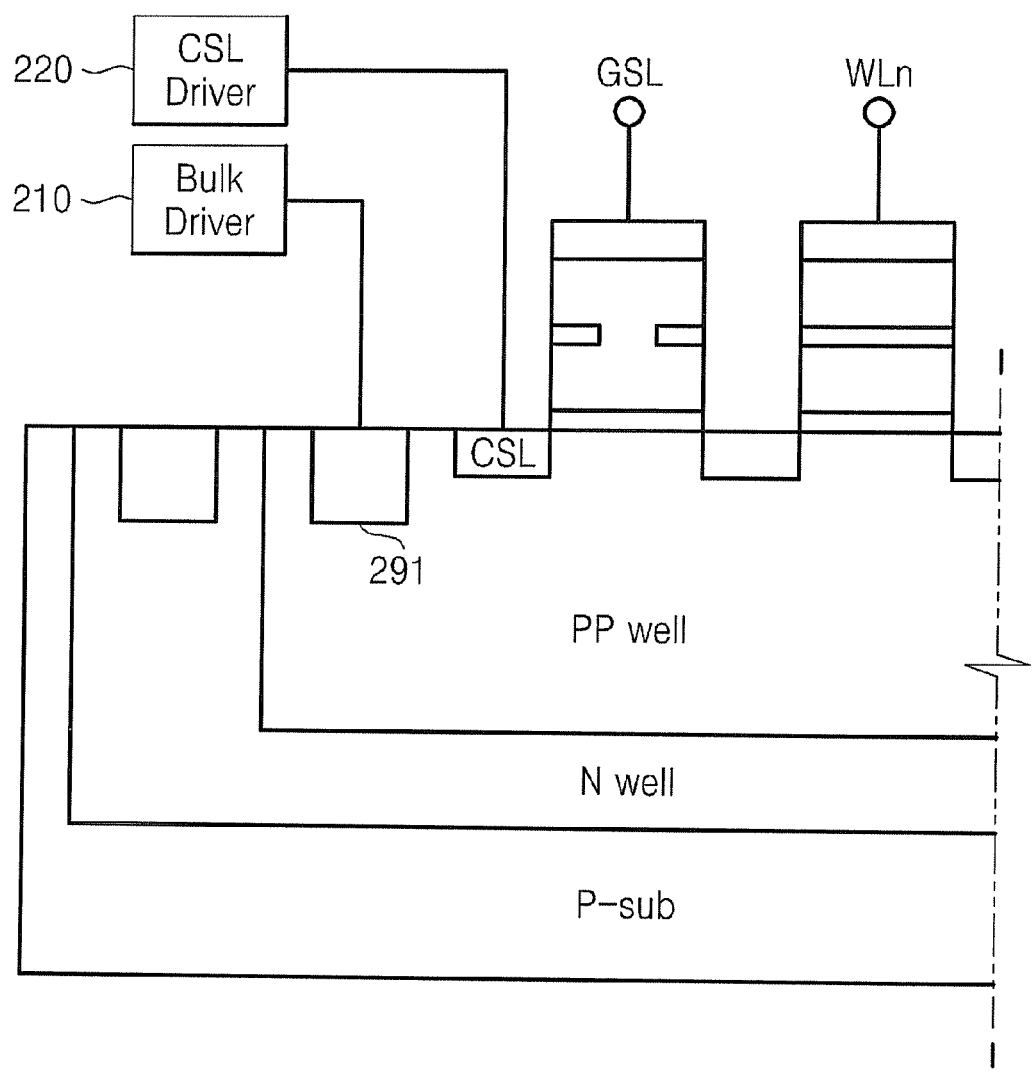
FIG. 6B is a diagram illustrating the connection of a memory cell array, a common source line driver, and a bulk driver of FIG. 6A.

FIG. 6B is a diagram illustrating the connection of a memory cell array 230", the CSL driver 220, and the bulk driver 210 illustrated in FIG. 6A. The bulk driver 210 may apply a bulk voltage to a PP well (herein referred to as a bulk) within an N well formed in a P-type substrate. The bulk voltage may be either a positive voltage or a negative voltage. Reference numeral 291' in FIG. 6B may denote an active area receiving the bulk voltage applied to the PP well. The CSL driver 220 may apply a bias voltage to the common source line CSL in order to increase the potential of the common source line CSL, reducing boosting charge leakage at selection transistors connected to the ground selection line GSL.

For example, during a program operation, the bulk driver 210 may apply a ground voltage to the PP well and the CSL driver 220 may apply a bias voltage (e.g., 1 V) to the common source line CSL. During an erase operation, the bulk driver 210 may apply an erase voltage (e.g., 20 V) to the PP well and the CSL driver 220 may float the common source line CSL. The bulk driver 210 and the CSL driver 220 may apply different voltage to the PP well and the common source line CSL, respectively. Unlike example embodiments of the inventive concepts, the comparative example may use two different types of drivers to reduce boosting charge leakage and may be less efficient than devices according to example embodiments.

Figure 7:
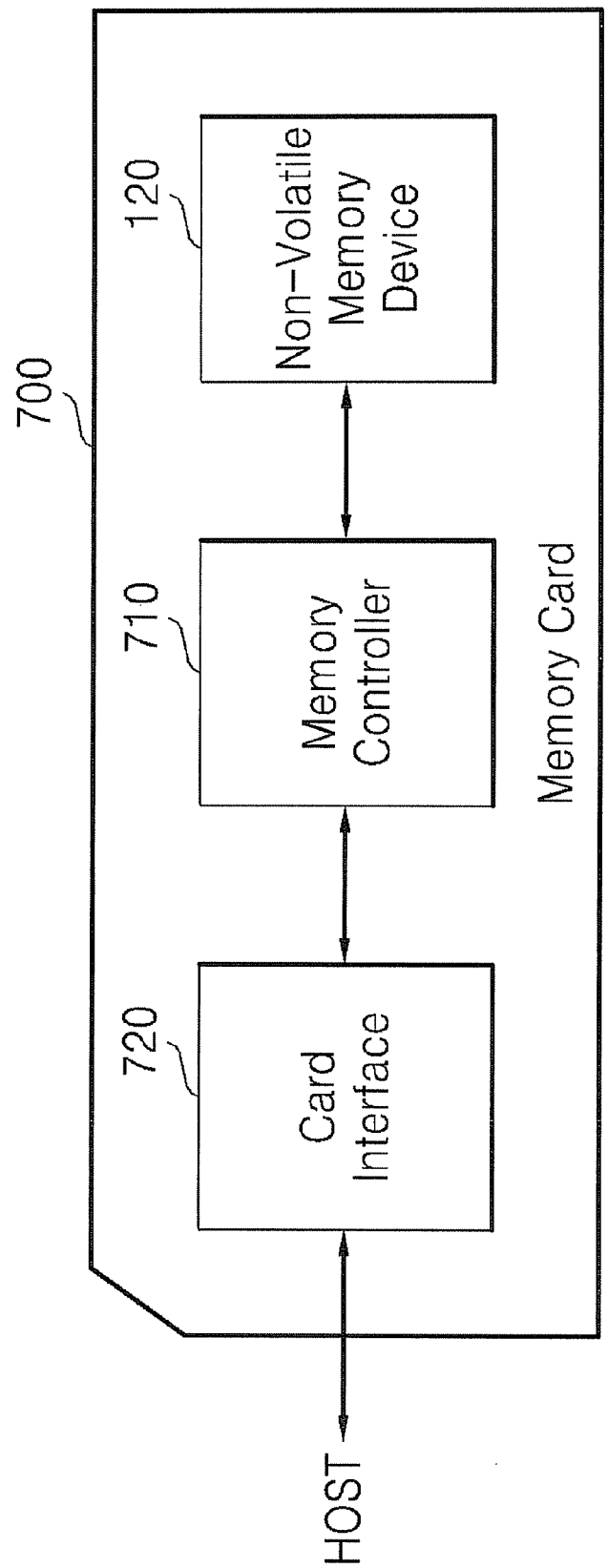

FIG. 7 illustrates memory systems 700 including non-volatile memory devices 120 illustrated in FIG. 1A according to some example embodiments of the inventive concepts. The memory system 700 may include a memory controller 710 and a card interface 720. The memory controller 710 may control data exchange between the non-volatile memory device 120 and the card interface 720. The memory system 700 may be, for example, a smart card. The card interface 720 may be a secure digital (SD) card interface and/or a multimedia card (MMC) interface, but example embodiments are not restricted thereto.

The card interface 720 may control data exchange between a host and the memory controller 710 according to the type of the host. When the memory system 700 is connected to the host (e.g., a computer, a digital camera, a digital audio player, a cellular phone, a console video game hardware, and/or a digital set-top box) the memory controller 710 of the memory system 700 and a controller included in the host may transmit and may receive to and from each other data stored in the non-volatile memory device 120.

Figure 8:
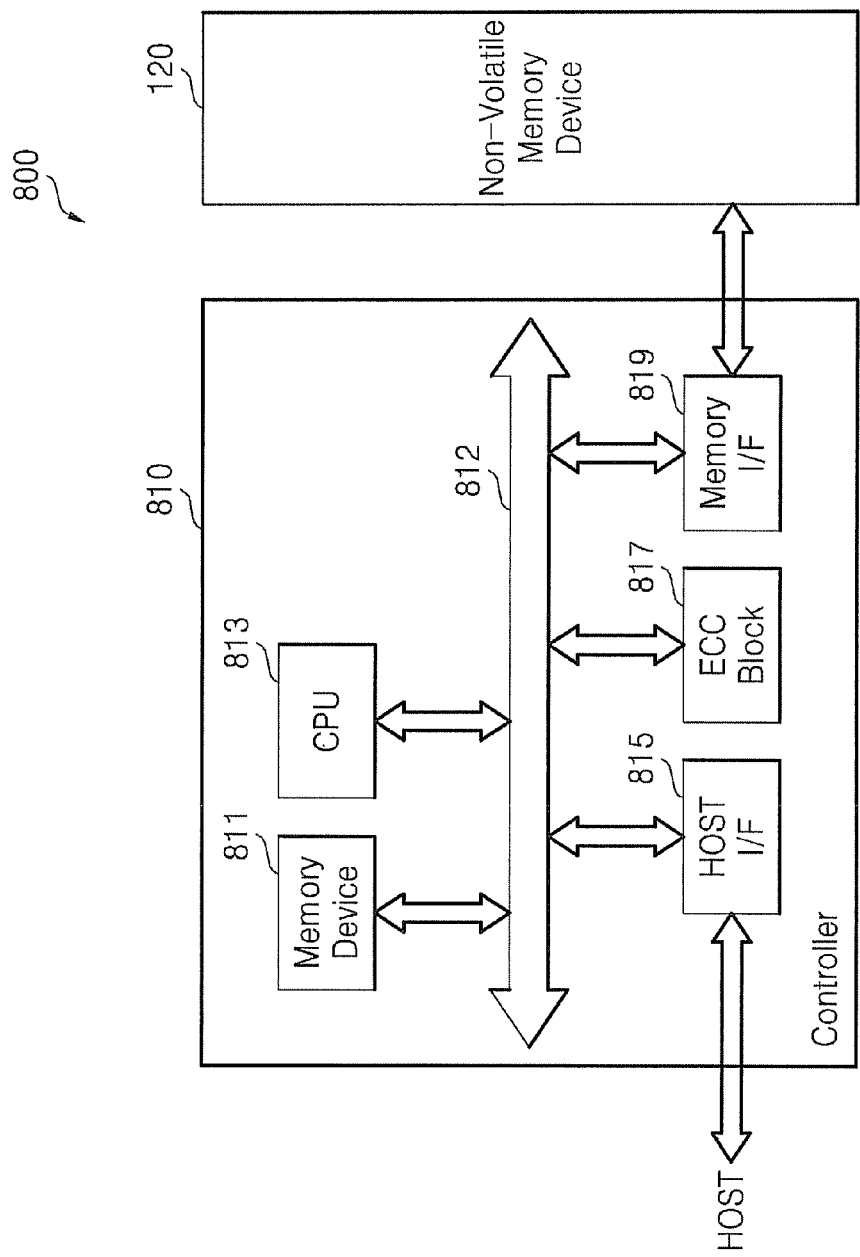

FIG. 8 is a block diagram of memory systems 800 including non-volatile memory devices 120 illustrated in FIG. 1A according to other example embodiments of the inventive concepts. The memory controller 810 may include a memory device 811 used as an operation memory for a central processing unit (CPU) 813. The memory device 811 may be, for example, dynamic random access memory (DRAM) and/or static RAM (SRAM). A host interface 815 may exchange data between a host connected to the memory system 800 and the memory controller 810 according to the protocol of the host.

An error correction code (ECC) block 817 may detect and correct errors in data read from the non-volatile memory device 120. A memory interface 819 may interface data between the non-volatile memory device 120 and the memory controller 810. The CPU 813 may control data exchange among the memory device 811, the host interface 815, the ECC block 817, and the memory interface 819 through a bus 812. The memory system 800 may be, for example, a universal serial bus (USB) flash drive and/or a memory stick.

Figure 9:
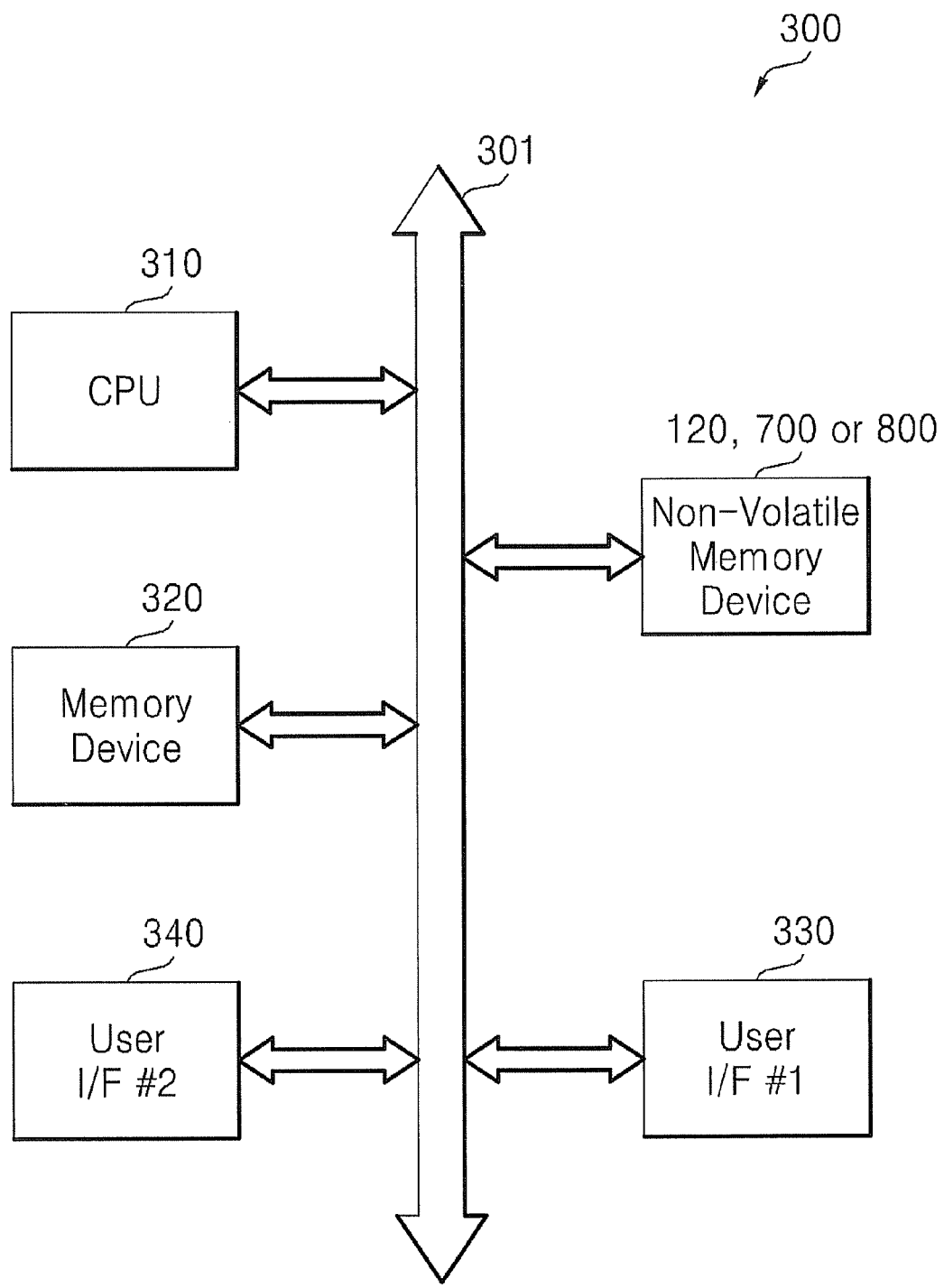

FIG. 9 is a block diagram of memory systems 300 including non-volatile memory devices 120 illustrated in FIG. 1A according to further example embodiments of the inventive concepts. Referring to FIG. 9, a memory system 300 may be, for example, a cellular phone, a smart phone, a personal digital assistant (PDA), a digital camera, a portable game console, an MP3 player, a high-definition television (HDTV), a global positioning system (GPS), a navigator, consumer equipment (CE), a digital set-top box, and/or an information technology (IT) device. The memory system 300 may include a CPU 310 and a non-volatile memory device 120 connected to each other through a bus 301. The memory system 300 may include the CPU 310 and the memory system 700 and/or 800 illustrated in FIG. 7 or 8, which may be connected to each other through the bus 301.

The CPU 310 may control operations (e.g., program, read and/or erase operations) and data transmission to a host of a non-volatile memory device 120, a memory system 700 and/or a memory system 800. A memory device 320 connected to the bus 301 may be used as an operation memory for the CPU 310. The memory device 320 may include, for example, DRAM and/or SRAM. The memory device 320 may be a memory module, for example, a single inline memory module (SIMM) and/or a dual inline memory module (DIMM), including a plurality of non-volatile memory devices 120 illustrated in FIG. 1A.

The memory system 300 may include a first user interface 330, for example, a display and/or a touch pad. The memory system 300 may include a second user interface 340, for example, an I/O interface. The second user interface 340 may be an output device, for example, a printer and/or an input device (e.g., a keyboard and/or a mouse). The first user interface 330 may be, for example, replaced by a complementary metal-oxide semiconductor (CMOS) image sensor. The CMOS image sensor may be controlled by the CPU 310 to convert an optical image into a digital image and may store the digital image in a non-volatile memory device 120, a memory system 700 and/or a memory system 800.

Figure 10:
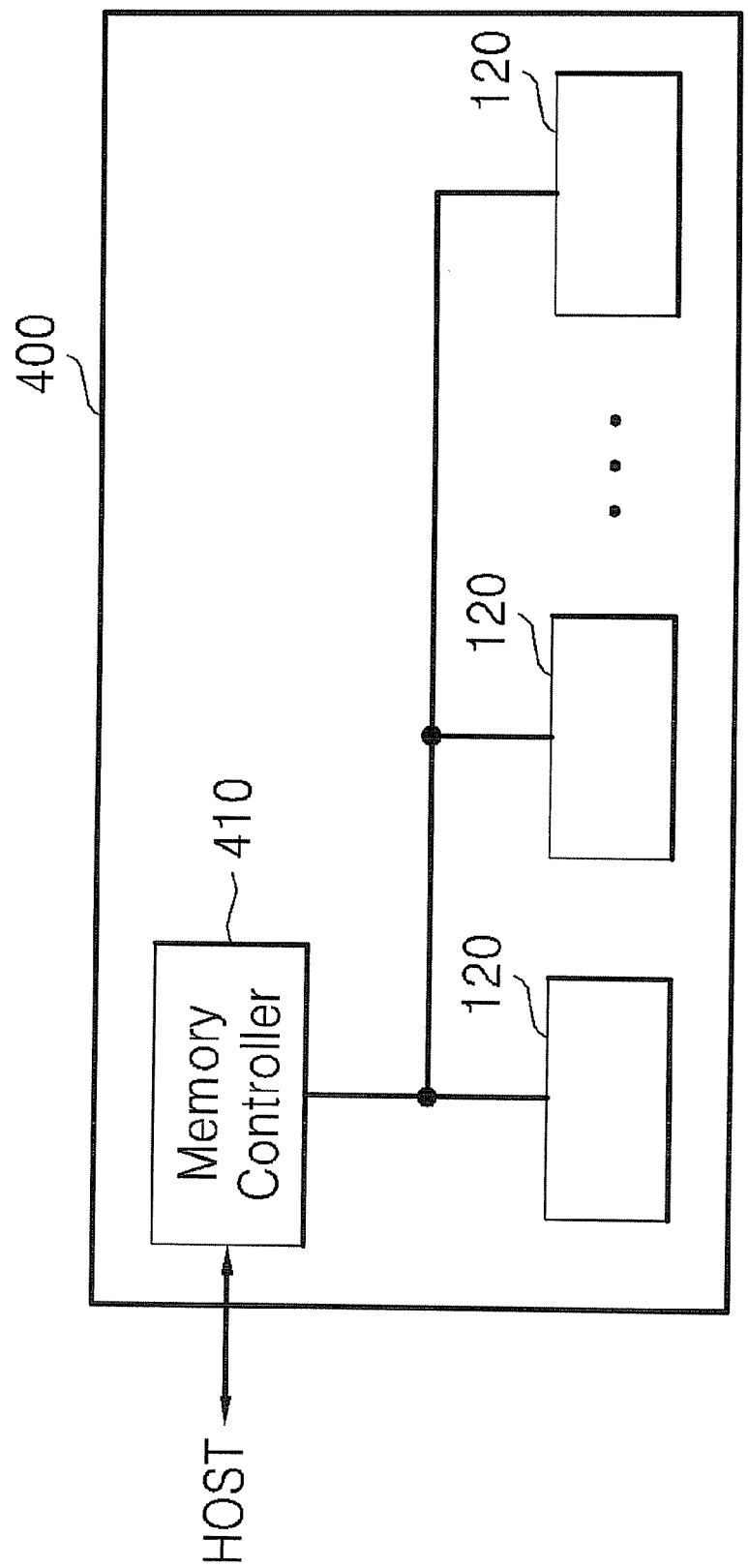

FIG. 10 is a block diagram of memory systems 400 including non-volatile memory devices 120 illustrated in FIG. 1A according to yet other example embodiments of the inventive concepts. Referring to FIG. 10, the memory system 400 may be, for example, a solid state drive (SSD). The memory system 400 may include a plurality of non-volatile memory devices 120 and a memory controller 410 controlling the operation of the non-volatile memory devices 120.

Figure 11:
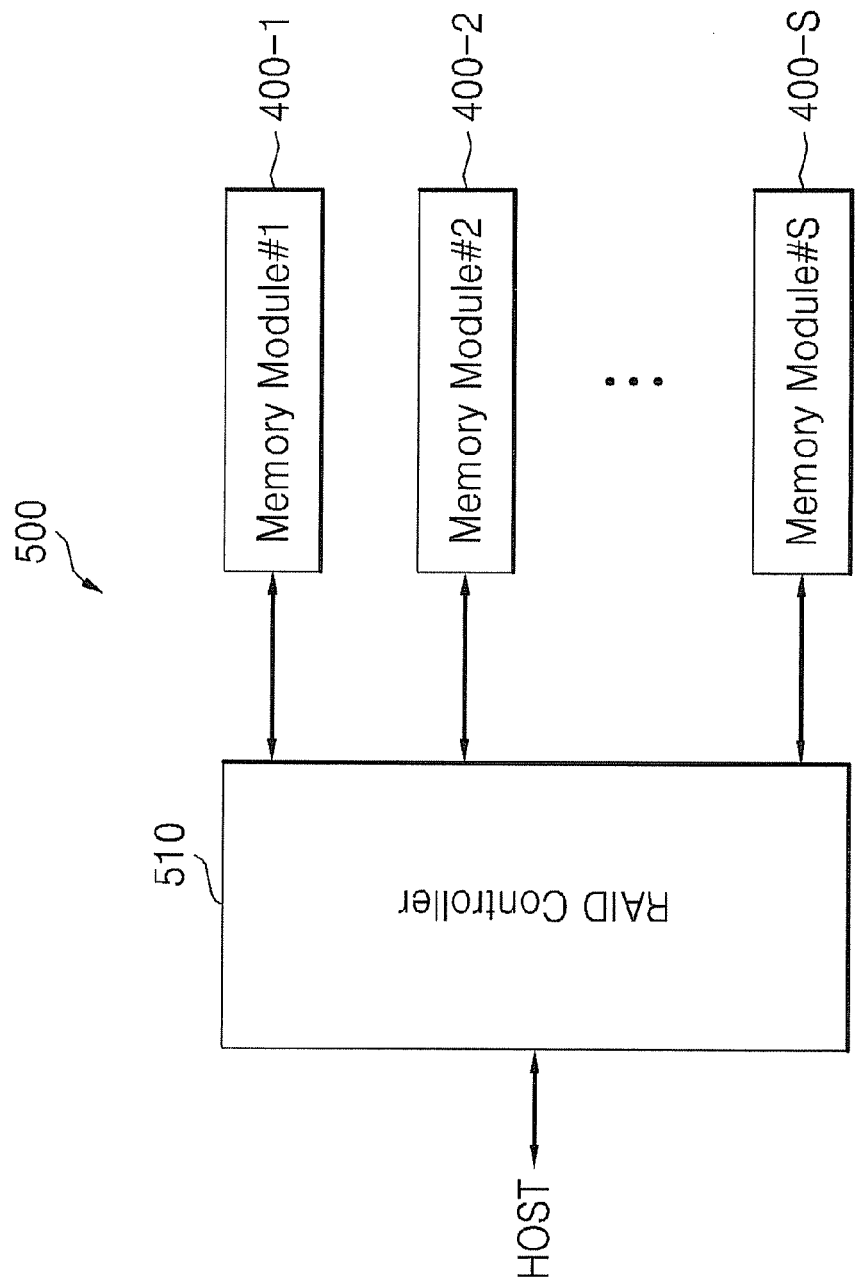

FIG. 11 is a block diagram of data storage systems 500 including memory systems 400 illustrated in FIG. 10. Referring to FIGS. 10 and 11, the data storage system 500 may be a redundant array of independent disks (RAID) system and include a RAID controller 510 and a plurality of memory modules 400-1 through 400-S where "S" is a natural number. Each of the memory modules 400-1 through 400-S may be a memory system 400 illustrated in FIG. 10. The memory modules 400-1 through 400-S may form a RAID array. The data storage system 500 may be, for example, a personal computer (PC) and/or an SSD. Each of the memory modules 400-1 through 400-S may include a plurality of the non-volatile memory devices 120 and the memory controller 410 controlling the operation of the non-volatile memory devices 120. The RAID controller 510 may control the operation of the memory modules 400-1 through 400-S.

In a write or program operation, the RAID controller 510 may output write and/or program data received from a host to one of the memory modules 400-1 through 400-S according to one RAID level selected from among a plurality of RAID levels based on RAID level information in response to a write and/or program command received from the host. In a read operation, the RAID controller 510 may output to the host data read from one of the modules 400-1 through 400-S according to one RAID level selected from among a plurality of RAID levels based on RAID level information in response to a read command received from the host.

According to some example embodiments of the inventive concepts, charge leakage due to boosting may be efficiently reduced in a 3D memory device.

While example embodiments have been particularly shown and described, it will be understood by one of ordinary skill in the art that variations in form and detail may be made therein without departing from the spirit and scope of the claims.

What is claimed is:

1. A three-dimensional (3D) non-volatile memory device, comprising:
   a memory cell array; and
   a merge driver configured to apply a merge voltage to a common source line and a bulk semiconductor in the memory cell array, the bulk semiconductor including a well region of the memory cell array.

2. The 3D non-volatile memory device of claim 1, wherein the bulk semiconductor includes a pocket p-type (PP) well of the memory cell array.

3. The 3D non-volatile memory device of claim 2, wherein the merge driver is configured to apply the merge voltage to the common source line and the bulk semiconductor during one of a read operation, a program operation, and an erase operation.

4. The 3D non-volatile memory device of claim 3, wherein the merge driver is configured to apply a ground voltage to the common source line and the bulk semiconductor during one of the read operation and the program operation.

5. The 3D non-volatile memory device of claim 3, wherein the merge driver is configured to apply an erase voltage to the common source line and the bulk semiconductor during the erase operation.

6. The 3D non-volatile memory device of claim 1, further comprising:
a chip controller configured to control the merge driver.

7. The 3D non-volatile memory device of claim 1, further comprising:
a voltage generator configured to output at least one voltage to the merge driver.

8. The 3D non-volatile memory device of claim 1, wherein the 3D non-volatile memory device includes NAND flash memory.

9. The 3D non-volatile memory device of claim 1, wherein the memory cell array includes at least one cell string connected to at least one bit line;
the cell string includes a first selection transistor connected to a string selection line, a plurality of memory cells, and a second selection transistor connected to a ground selection line and the common source line; and
the merge driver is configured to apply the merge voltage to the common source line and the bulk semiconductor during one of a read operation, a program operation, and an erase operation, the bulk semiconductor including a pocket p-type (PP) well of the memory cell array.

10. A memory system, comprising:
the 3D non-volatile memory device of claim 1; and
a memory controller configured to control the 3D non-volatile memory device.

11. A memory card, comprising:
the 3D non-volatile memory device of claim 1;
a card interface; and
a controller configured to control data exchange between the card interface and the 3D non-volatile memory device.

12. A data storage system comprising:
a plurality of memory modules forming a redundant array of independent disks (RAID) array, each of the memory modules including a plurality of three-dimensional (3D) non-volatile memory devices and a memory controller configured to control operations of the 3D non-volatile memory devices, each of the 3D non-volatile memory devices including
a memory cell array, and
a merge driver configured to apply a merge voltage to a common source line and a bulk semiconductor in the memory cell array, the bulk semiconductor including a well region of the memory cell array; and
a RAID controller configured to control operations of the memory modules.

13. The data storage system of claim 12, wherein the bulk semiconductor is a pocket p-type (PP) well of the memory cell array.

14. The data storage system of claim 13, wherein the merge driver is configured to apply the merge voltage to the common source line and the bulk semiconductor during one of a read operation, a program operation, and an erase operation.

15. The data storage system of claim 14, wherein the merge driver is configured to apply a ground voltage to the common source line and the bulk semiconductor during one of the read operation and the program operation.

16. A three-dimensional (3D) non-volatile memory device, comprising:
a single driver; and
a common source line commonly connected with a device active region and the single driver, the single driver being configured to apply a voltage to the common source line and the device active region.

17. The 3D non-volatile memory device of claim 16, wherein the device active region includes a bulk semiconductor.

18. The 3D non-volatile memory device of claim 17, wherein the common source line and the bulk semiconductor are configured to receive a bulk voltage.

19. The 3D non-volatile memory device of claim 18, wherein the bulk voltage is applied to a pocket p-type well in the bulk semiconductor.

* * * * *